United States Patent
Chowdhury et al.

(10) Patent No.: US 9,571,074 B2
(45) Date of Patent: Feb. 14, 2017

(54) EFFICIENT SKEW SCHEDULING METHODOLOGY FOR PERFORMANCE AND LOW POWER OF A CLOCK-MESH IMPLEMENTATION

(71) Applicants: Ahsan H. Chowdhury, Austin, TX (US); Brian Millar, Austin, TX (US); John M. Fedor, Austin, TX (US); Michael P. Lewis, Austin, TX (US)

(72) Inventors: Ahsan H. Chowdhury, Austin, TX (US); Brian Millar, Austin, TX (US); John M. Fedor, Austin, TX (US); Michael P. Lewis, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/814,495

(22) Filed: Jul. 30, 2015

(65) Prior Publication Data
US 2016/0118966 A1 Apr. 28, 2016

Related U.S. Application Data

(60) Provisional application No. 62/069,278, filed on Oct. 27, 2014, provisional application No. 62/069,276, filed on Oct. 27, 2014.

(51) Int. Cl.
*H03L 7/00* (2006.01)
*H03K 5/05* (2006.01)
*G06F 1/10* (2006.01)

(52) U.S. Cl.
CPC .. *H03K 5/05* (2013.01); *G06F 1/10* (2013.01)

(58) Field of Classification Search
CPC ....................................................... H03K 5/05
See application file for complete search history.

(56) References Cited

U.S. PATENT DOCUMENTS

| | | | |
|---|---|---|---|
| 6,550,045 B1 * | 4/2003 | Lu | G06F 17/5045 716/114 |
| 7,296,246 B1 | 11/2007 | Kuehlmann et al. | |
| 7,937,604 B2 | 5/2011 | Banerji et al. | |
| 8,539,413 B1 | 9/2013 | Singla et al. | |

* cited by examiner

*Primary Examiner* — Daniel Puentes
(74) *Attorney, Agent, or Firm* — Renaissance IP Law Group LLP

(57) ABSTRACT

According to one aspect, a method may include receiving a circuit model that includes a clock mesh that controls each of a plurality of logic circuits by inputting a respective clock signal to an end-point of each logic circuit. The method may include providing an incremental latency adjustment to the circuit model by determining one or more end-points that are candidates for adjustment of a respective end-point's clock skew schedule. And, for each end-point that is associated with a negative front slack, adjusting a clock skew schedule of an end-point by a quantized amount. Further, for each end-point that is associated with a negative back-slack, adjusting the clock skew schedule of an end-point that is associated by a quantized amount. The method may also include repeating, the step of providing an incremental timing update. The method may include performing a timing evaluation upon the circuit model.

15 Claims, 4 Drawing Sheets

EFFICIENT SKEW SCHEDULING METHODOLOGY FOR PERFORMANCE AND LOW POWER OF A CLOCK-MESH IMPLEMENTATION

CROSS-REFERENCE TO RELATED APPLICATION

This application claims priority under 35 U.S.C. §119 to Provisional Patent Application Ser. No. 62/069,278, entitled "EFFICIENT SKEW SCHEDULING METHODOLOGY FOR PERFORMANCE & LOW POWER OF A CLOCK-MESH IMPLEMENTATION" filed on Oct. 27, 2014. The subject matter of this earlier filed application is hereby incorporated by reference.

This application claims priority under 35 U.S.C. §119 to Provisional Patent Application Ser. No. 62/069,276, entitled "A NOVEL LOW POWER MINIMAL DISRUPTIVE METHOD TO IMPLEMENT LARGE QUANTITY PUSH & PULL USEFUL-SKEW SCHEDULES WITH ENABLING CIRCUITS IN A CLOCK-MESH BASED DESIGN" filed on Oct. 27, 2014. The subject matter of this earlier filed application is hereby incorporated by reference.

TECHNICAL FIELD

This description relates to the design of electrical circuits, and more specifically to the timing of a clock network.

BACKGROUND

The operation of most digital circuit systems, such as computer systems, is synchronized by a periodic signal known as a "clock" that dictates the sequence and pacing of the devices of the circuit. Often, this clock is distributed from a single source to all the memory elements of the circuit, which are also called registers, latches, flip-flops, or memories. In a circuit using edge-triggered flip-flops, when the clock edge or tick arrives at a flip-flop, the flip-flop transfers the flip-flop input to the flip-flop output, and these new output values flow through combinational logic to provide the values at a next flip-flop's inputs for the next clock tick.

Ideally, the input to each memory element reaches its final value to be computed in time for the next clock tick so that the behavior of the whole circuit can be predicted exactly. The maximum speed or clock frequency at which a system may run generally accounts for the variance that occurs between the various elements of a circuit due to differences in physical composition, temperature, and path length.

In circuit designs, clock skew (sometimes called timing skew) is a phenomenon in synchronous circuits in which the clock signal (sent from the clock circuit) arrives at different components at different times. Occasionally, this may be caused by many different things, such as wire-interconnect length, temperature variations, variation in intermediate devices, capacitive coupling, material imperfections, differences in input capacitance on the clock inputs of devices using the clock, random and systemic variation and clock jitter, etc. As the clock rate of a circuit increases, timing becomes more critical and less variation can be tolerated if the circuit is to function properly.

Generally, there are two types of useful skew. Positive skew occurs when the receiving flip-flop receives the clock tick later than the sending flip-flop (push). Negative skew is the opposite: the receiving register gets the clock tick earlier than the sending register (pull). Zero clock skew refers to the arrival of the clock tick substantially simultaneously at transmitting and receiving register.

SUMMARY

According to one general aspect, a method of adjusting clock skews may include receiving a circuit model that includes logic circuits at least partially controlled by a clock mesh, wherein the clock mesh, at least partially, controls each of the logic circuits by inputting a respective clock signal to an end-point of a respective logic circuit. The method may include providing an incremental latency adjustment to the circuit model by determining one or more end-points that are candidates for adjustment of a respective end-point's clock skew schedule. And, for each end-point that is associated with a negative front slack, adjusting a clock skew schedule of a respective end-point by a quantized amount, up to a maximum push threshold. Further, for each end-point that is associated with a negative back-slack, adjusting the clock skew schedule of a respective end-point that is associated by a quantized amount, up to a maximum pull threshold. The method may also include repeating, a plurality of times, the step of providing an incremental timing update to the circuit model. The method may include performing a timing evaluation upon the circuit model via either dynamic timing verification, static timing analysis, or both.

According to another general aspect, an apparatus may include a digital circuit receiver configured to store a model of a digital circuit. The digital circuit model may include models of: a clock mesh configured to provide a clock signal to a plurality of logic circuits, and a plurality of logic circuits, each logic circuit at least in partially controlled by an application of the clock signal to one or more end-points of the logic circuit. The apparatus may include an adjustment candidate identifier configured to identify one or more end-points that are either Pull Candidates or Push Candidates. The apparatus may include a clock pull scheduler configured to, for each Pull Candidate, reduce a clock latency of the clock signal to the respective end-point by a first quantized amount. The apparatus may include a timing model generator configured to update a timing model of the digital circuit after the clock pull scheduler has processed the digital circuit model. The apparatus may include a clock push scheduler configured to, for each Push Candidate, increase the clock latency of the clock signal to the respective end-point by a second quantized amount. The apparatus may be configured to incrementally adjust the clock timing of the digital circuit model, via a number of passes through the adjustment candidate identifier, clock pull scheduler, timing model generator, and the clock push scheduler.

According to another general aspect, a computer program product for adjusting clock skew schedules of a digital circuit may exist. The computer program product may be tangibly embodied on a computer-readable medium and including executable code that, when executed, is configured to cause a data processing apparatus to receive a circuit model that includes logic circuits at least partially controlled by a clock mesh, wherein the clock mesh, at least partially, controls each of the logic circuits by inputting a respective clock signal to an end-point of a respective logic circuit. The instructions may be configured to provide an incremental timing update to the circuit model by determining one or more end-points that are associated with an amount of absolute slack that is greater than a minimum slack threshold. And, for each end-point that is associated with a negative front slack, adjusting a clock skew schedule of a respective end-point that is associated with negative front slack by a quantized amount, up to a maximum push threshold. And further, for each end-point that is associated with a negative back slack, adjusting the clock skew schedule of a respective end-point that is associated with negative back slack by a quantized amount, up to a maximum pull threshold.

The details of one or more implementations are set forth in the accompanying drawings and the description below. Other features will be apparent from the description and drawings, and from the claims.

A system and/or method for the design of electrical circuits, and more specifically to the timing of a clock network, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
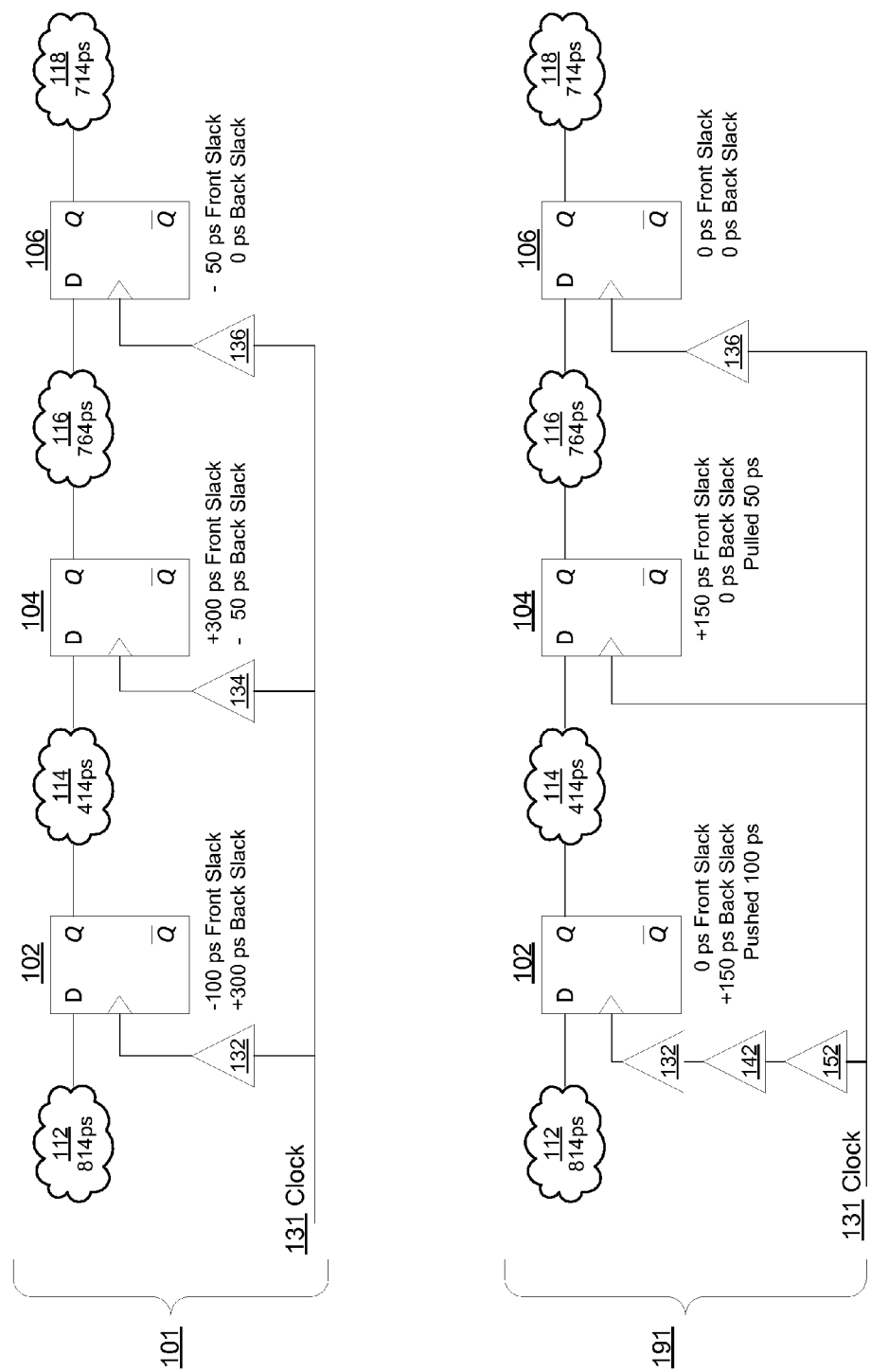
FIG. 1 is a block diagram of an example embodiment of a system in accordance with the disclosed subject matter.

Various example embodiments will be described more fully hereinafter with reference to the accompanying drawings, in which some example embodiments are shown. The present disclosed subject matter may, however, be embodied in many different forms and should not be construed as limited to the example embodiments set forth herein. Rather, these example embodiments are provided so that this disclosure will be thorough and complete, and will fully convey the scope of the present disclosed subject matter to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present disclosed subject matter.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present disclosed subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosed subject matter.

Unless otherwise defined, all terms (including technical and scientific terms) used herein have the same meaning as commonly understood by one of ordinary skill in the art to which this disclosed subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a block diagram of an example embodiment of a system 100 in accordance with the disclosed subject matter. The illustrated embodiment shows a simplified example of timing violations before useful skew is introduced (shown in state 101) and the amelioration thereof (shown in state 191). In various embodiments, the amelioration of the clock skew may be accomplished via the disclosed subject matter.

In the illustrated embodiment, the system 100 may include three flip-flops (or more generally "end-points") 102, 104, and 106. The system 100 may also include four combinatorial logic portions 112, 114, 116, and 118. In various embodiments, the combinatorial logic portions may include various electrical circuits, such as, for example NAND gates, NOR gates, capacitors, resistors, etc.). It may take a certain amount of time for an input to the combinatorial logic to be processed and to result in an output from the combinatorial logic portion.

As described above, if this processing time is less than the period of the clock signal 131, than the circuit is said to have "positive slack". Conversely, if the processing time is greater than the period of the clock signal 131, than the circuit is said to have "negative slack", and more importantly, the outputs will not be ready when the flip-flop associated with the outputs stores the output signals. In various embodiments, this may be ameliorated by increasing the clock period or decreasing the clock frequency.

In the illustrated embodiment, the clock period is 714 picoseconds (ps) or a frequency of ~1.4 gigahertz (GHz). In the illustrated embodiment, the combinatorial logic 112 may take 814 ps to process. Therefore, the flip-flop 102 may have a front slack of −100 ps (i.e., 714 ps-814 ps), as combinatorial logic 112 is logically in front-of flip-flop 102. The clock signal may then be thought to arrive at the flip-flop 102 100 ps before the outputs of the combinatorial logic section 112 are ready or fully computed.

In the illustrated embodiment, the combinatorial logic 114 may take 414 ps to process. Therefore, the flip-flop 102 may have a back slack of +300 ps (i.e., 714 ps-414 ps), as combinatorial logic 114 is logically behind flip-flop 102. This means that flip-flop 102 could release the input signals 300 ps later than the inputs are currently released, and the combinatorial logic section 114 would still have enough time to fully compute the output values. The flip-flop 104 may have a front slack of +300 ps (i.e., 714 ps-414 ps).

It is understood that the examples described herein are merely a few illustrative examples to which the disclosed subject matter is not limited. For example, these examples have been simplified for illustrative purposes and do not include things like clock jitter, setup time, etc.

In the illustrated embodiment, the combinatorial logic 116 may take 764 ps to process. Therefore, the flip-flop 104 may have a back slack of −50 ps (i.e., 714 ps-764 ps) and the flip-flop 106 may have a front slack −50 ps (i.e., 714 ps-764 ps). In the illustrated embodiment, the combinatorial logic 118 may take 714 ps to process. Therefore, the flip-flop 106 may have a back slack of 0 ps (i.e., 714 ps-714 ps). It is understood that the above is merely one illustrative example to which the disclosed subject matter is not limited.

Likewise, in the illustrated embodiment, the clock network or clock mesh may include the clock signal 131, and a number of buffers or drivers 132, 134, and 136. In the illustrated embodiment, each buffer may delay the clock signal 131 by 50 ps. It is understood that the above is merely one illustrative example to which the disclosed subject matter is not limited.

As described above, in the original state (state 101), the system 100 has two flip-flops or end-points that are considered to have negative (front) slack, flip-flops 102 and 106. The failure of the logic 112 and 116 in front of these two flip-flops 102 and 106, causes the system 100 to not be able to meet its design goal of operating at 1.4 GHz, as a clock period of 814 ps (instead of the desired 714 ps) is needed to fully process the slowest logic portion (circuit 112).

FIG. 1 also shows the system 100 after the clock network has been altered or adjusted according to the disclosed subject matter (state 191). In such an embodiment, buffers have been added or removed from the clock network to increase (push) or decrease (pull) the clock latency experienced by each flip-flop. This adjustment of the clock latency, in turn, means that not all of the combinatorial logic portions (e.g., logic 112, etc.) are subjected to a strict 714 ps execution time. Instead, a given logic portion may have more time (e.g., 814 ps, etc.) or less time (e.g., 414 ps, etc.). In reference to the other figures, the technique employed, in various embodiments, to adjust the clock latency is described in greater detail. In the illustrated embodiment, the concept alone is introduced.

In the illustrated embodiment, the clock signal to the flip-flop 102 may be delayed 100 ps by the addition of two buffers (buffers 142 and 152). This may push the end of the execution time for the logic 112 out by 100 ps, giving it a full 814 ps to complete. This may result in the flip-flop 102 having a front slack of 0 ps.

However, pushing the clock to flip-flop 102 100 ps is not done in isolation. It also means the start of the next pipeline stage or combinatorial logic 114 is also pushed 100 ps. Fortunately, the logic 114 only needs 414 ps to complete and the delay is not a problem. The addition of the buffers 142 and 152 may give the flip-flop 104 a front slack of +200 ps.

But, the logic 112 may not have been the only problem portion, in the illustrated embodiment. Combinatorial logic 116 may also exceeded the desired 714 ps period with a computation time of 764 ps. In various embodiments, it may be desirable to make use of the excess slack available to flip-flop 104 to remove some strain on the logic 116.

In such an embodiment, the clock latency to the flip-flop 104 may be decreased or pulled. In one such embodiment, the buffer 134 may be removed from the clock network. This may cause the amount of time the logic 116 has to perform its computation to increase by 50 ps, or a total time of 764 ps. In such an embodiment, the flip-flop 104 may then have a front slack of +150 ps, and a back slack of 0 ps. Likewise, the flip-flop 106 (which has not had its clock latency pushed or pulled) may have a front slack of 0 ps and a back slack of 0 ps.

In another embodiment, if the logic 118 had had a processing time less than 714 ps (e.g., 614 ps), the clock latency of flip-flop 106 may have been pushed to accommodate the logic 116. In such an embodiment, the clock latency to flip-flop 104 may not have pulled. It is understood that the above is merely one illustrative example to which the disclosed subject matter is not limited.

In the illustrated embodiment, the clock signal 131 and buffers 132, 134, 136, 142, and 152 may be part of a clock mesh network. Generally, a clock mesh network is characterized by an extremely shallow logic depth between the mesh and the flip-flops or end-points. Usually just a single buffer (e.g., buffer 132, etc.) or clock gate directly drives the electrical sinks or end-points. This compares to a more conventional clock tree, which is often characterized by an organic tree structure from the clock root, that branches out to each of the sinks in the design. In a clock tree scheme there is often a relatively large depth for both buffer and clock-gating levels. This lack of depth in the number of buffers between the end-point and the root source of the clock signal 131 in a clock mesh network, reduces the opportunities for managing clock skew, specifically the opportunity for pulling the clock latency.

In the illustrated embodiment, each buffer (e.g., buffer 142, buffer 134, etc.) may cause a delay to the clock signal 131 of 50 ps. In various embodiments, the disclosed subject matter may be configured to operate using quantized amounts to push or pull the clock skew. In such an embodiment, it may not be possible to adjust the clock latency to a specific desired value (e.g., 800 ps) but only to a value close to the desired value as dictated by the granularity of the quantized amount (e.g., 814 ps, 764 ps, etc.). It is understood that in various embodiments the levels of quantization may change (e.g., 40 ps, 100 ps, 15 ps, etc.). It is understood that the above are merely a few illustrative examples to which the disclosed subject matter is not limited.

Figure 2:
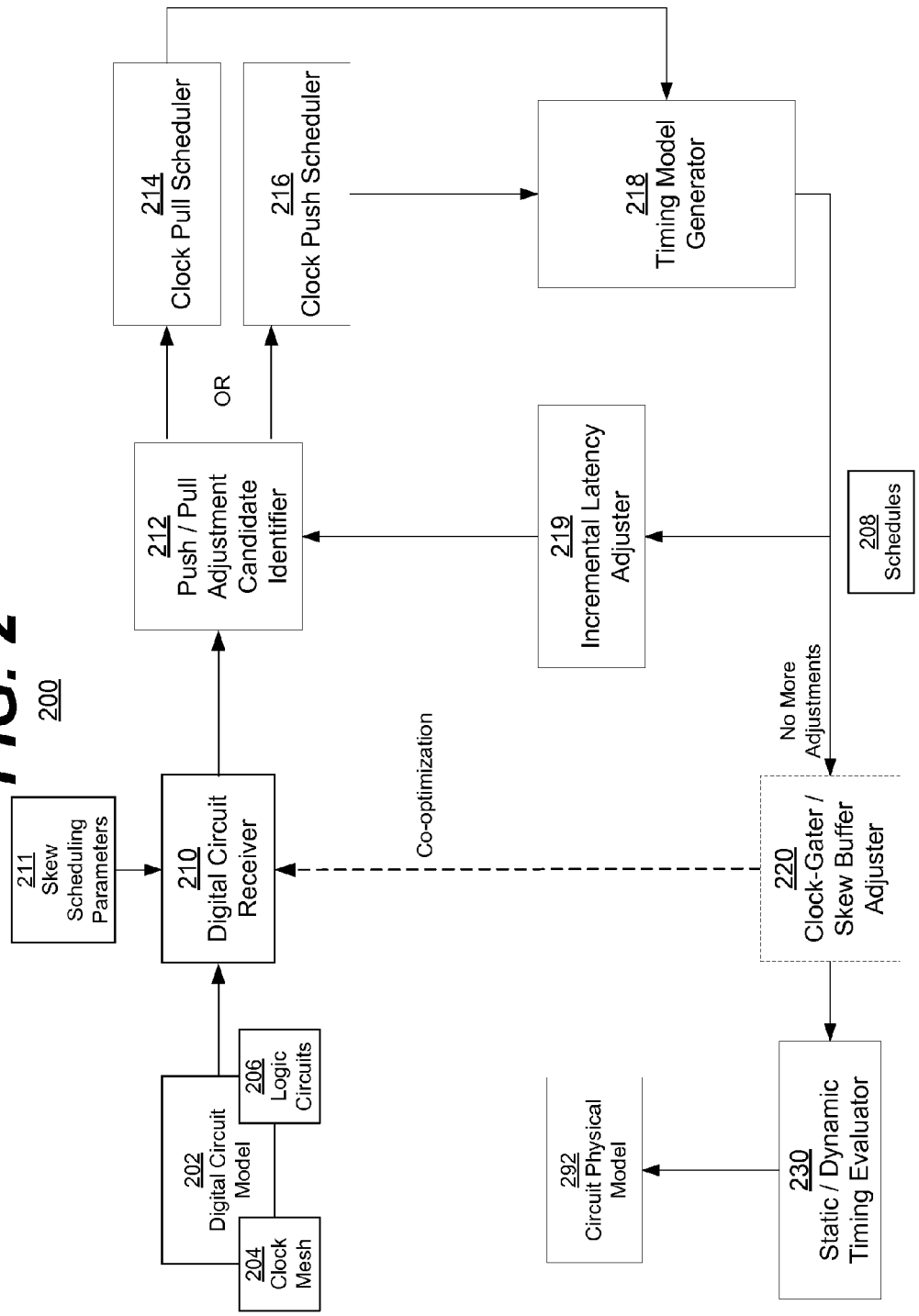
FIG. 2 is a block diagram of an example embodiment of a system in accordance with the disclosed subject matter.

FIG. 2 is a block diagram of an example embodiment of a system 200 in accordance with the disclosed subject matter. In the illustrated embodiment, during the integrated circuit design process, a digital circuit model 202 may be created. It may be desirable to determine a set of clock latency schedules 208. The components of system 200 may be employed to determine a set of clock latency schedules 208 of the model 202 as described below.

In the illustrated embodiment, the system 200 may be employed to determine a set of clock latency schedules 208 of the digital circuit model 202 before performing physical circuit synthesis or subjecting the model 202 to more rigorous timing evaluation techniques. In another embodiment, the system 200 may be employed to adjust the clock skew of the model 202 late in the design process (e.g., as late as final timing, etc.). In various embodiments, by running a digital circuit model 202 through the system 200 late in the design process, one may benefit from being able to use the most accurate timing in order to fix the truly most critical paths. It is understood that the above is merely one illustrative example to which the disclosed subject matter is not limited.

In one embodiment, the system 200 may receive a digital circuit model 202. In various embodiments, the digital circuit model 202 may include a physically synthesized, or laid out model. In another embodiment, the model 202 may include a representation of the circuit intermediate to the two ends of the design process. It is understood that the above are merely a few illustrative examples to which the disclosed subject matter is not limited.

In various embodiments, the circuit model 202 may include a clock mesh 204 (or a representation thereof). In such an embodiment, the clock mesh 204 may be configured to provide a clock signal to a plurality of logic circuits 206 (or a representation thereof). In such an embodiment, the clock signal may arrive at each logic circuit 206 with a respective amount of clock latency, as described above.

In various embodiments, the circuit model 202 may include a plurality of logic circuit 206, as described above. In some embodiments, each logic circuit 206 may be at least partially controlled by the clock signal to one or more end-points of the respective logic circuit 206. In this context, an end-point may include a flip-flop, latch, or other register or state device (e.g., the flip-flops of FIG. 1, memories, etc.). In various embodiments, an end-point may mark the beginning/ending of a pipeline stage.

In one embodiment, the system 200 may include a digital circuit receiver 210. The digital circuit receiver 210 may be configured to receive the digital circuit model 202. In various embodiments, the digital circuit receiver 210 may also be configured to receive one or more skew scheduling parameters 211.

In some embodiments, these parameters 211 may include one or more of: the push step size, the pull step size, a maximum push limit or threshold, a maximum pull limit or threshold, and a slack threshold.

In various embodiments, a Push Step Size parameter may dictate a form of push quantization (e.g., by the clock push scheduler 216, etc.) that conforms to the actual step size provided by real-world skew buffers (or other circuit; e.g., a clock-gater buffer delay, etc.). This parameter may avoid a loss of implementation efficiency found in a traditional clock-tree system (CTS) based method. In the illustrated embodiment, by employing a quantized push step size, the theoretical or pre-implementation clock latency schedule may correlate better with the physical or post-implementation of the mesh 204.

In some embodiments, a Pull Step Size parameter may similarly dictate a form of pull quantization (e.g., by the clock pull scheduler 214, etc.) that conforms to the actual step size provided by the removal of real-world skew buffers (or other circuit; e.g., a clock-gater buffer delay, etc.). In various embodiments, the Pull Step Size may be similar in function or value to the Push Step Size.

In one embodiment, a Maximum (Max) Push Amount parameter may set an upper value for the maximum amount of clock latency schedule that may be added to any end-point. In one embodiment, this may allow how performance/power tradeoff is determined. For example, as more skew buffers (or other circuit) is added more power may be consumed, but the over-all timing of the digital circuit may be improved (e.g., pushing the clock solves various timing issues, etc.). In such an embodiment, the Max Push Amount parameter may limit the amount of power consumed by added skew buffers. Further, in some embodiments, the Max Push Amount parameter may be dictated by implementation limitations such as, for example, congestion, disruption of cells, etc.

In various embodiments, a Maximum (Max) Pull Amount parameter may set a value for the maximum amount of clock latency schedule that may be subtracted from any end-point. In various embodiments, this may allow for controllability of Pull scheduling, independent of Push scheduling. Further, in some embodiments, pull scheduling may be achieved by removing skew buffers (or clock gater buffer delay adjustments) from the design. In some embodiments, there may be a limit to the number of skew buffers that may be removed. For example, in FIG. 1, only buffer 134 existed as an input to flip-flop 104. Therefore, the Max Pull Amount associated with flip-flop 104 (or the system 100 in general) may have been one buffer (represented in terms of time, buffers, steps, etc.).

In various embodiments, a Slack Threshold to Skew parameter may allow a desired tradeoff between total negative slack (TNS) and worst negative slack (WNS) to be set. This may facilitate a tradeoff between performance and power. It is understood that the above are merely a few illustrative examples to which the disclosed subject matter is not limited.

In another embodiment, the digital circuit receiver 210 may receive the parameters 211 and pass them along with the digital circuit model 202 to one or more of other components of the system 200. In such an embodiment, the functioning of the other components of the system 200 may be modified or limited. For example, as described above, the push step size may dictate the level or amount of quantization that may be employed by the clock push scheduler 216 when attempting to push clock latency for a given end-point, likewise with the pull step size parameter and the clock pull scheduler 214. It is understood that the above are merely a few illustrative examples to which the disclosed subject matter is not limited.

In the illustrated embodiment, the system 200 may include a push/pull adjustment candidate identifier 212. In various embodiments, the adjustment candidate identifier 212 may be configured to identify one or more end-points that include an amount of front slack or an amount of back slack.

While the description of the disclosed subject matter may refer predominantly to setup slack and timings, in various embodiments, the disclosed subject matter may also be employed to address other forms of slack, such as hold slack. It is understood that the above is merely one illustrative example to which the disclosed subject matter is not limited. In another embodiment, useful skew scheduling can be employed to improve power rather than timing slack. In yet another embodiment, useful skew scheduling can be employed to improve hold timings rather than setup timing.

In various embodiments, the push/pull adjustment candidate identifier 212 may be configured to bucket end-points into two (or more) categories. In one such embodiment, a first category may include end-points which are candidates to be Pushed. In one embodiment, an end-point may be a Push candidate if it includes a front-slack that is less than its back-slack, its front-slack is negative, and it has a front slack that is worse than the "Slack Threshold to Skew" threshold. A second category may include end-points that are candidates to be Pulled. In one embodiment, an end-point may be a Pull candidate if it includes a front-slack that is greater than its back-slack, its back-slack is negative, and it has a back slack that is worse than the "Slack Threshold to Skew" threshold. In various embodiments, end-points that are neither candidates for being Pushed or Pulled may be skipped. In some embodiments, these skipped or non-candidate end-points may include a third category. In other embodiments, the skipped endpoints may be scheduled for power reduction of the digital circuit. It is understood that the above is merely one illustrative example to which the disclosed subject matter is not limited.

In the illustrated embodiment, the system 200 may include a clock pull scheduler 214. In such an embodiment, the clock pull scheduler 214 may be configured for reducing the clock latency of the clock signal to the respective pull candidate end-point by a first quantized amount.

The pseudo-code below illustrates an example technique for calculating the amount of push and pull adjustment of a candidate endpoint. In various embodiments, such a technique may be employed by the clock pull scheduler 214 and/or the clock push scheduler 216. It is understood that the above is merely one illustrative example to which the disclosed subject matter is not limited.

```
if ($slack_front < $slack_back} (
         ##########push situation#########
         # for this case we have back slack better, so let 's
degrade back slack to improve front slack
         set num_step 0
         while {($slack_front < $slack_threshold) &&
($slack_back >= [expr $slack_front + $step])} {
                  set num_step [expr $num_step + 1]
                  set slack_front [expr $slack_front + $step]
                  set slack_back [expr $slack_back − $step]
         }
         # slack adjustment for push will be $num_step * $step
         } else {
         ##########pull situation#########
         # for this case we have front slack better, so let's degrade
front slack to improve back slack
         set num_step 0
         while {($slack_back < $slack_threshold) &&
```

-continued

```
($slack_front >= [expr $slack_back + $step] ) ) {
                  set num_step [expr $num_step − 1]
                  set slack_front [expr $slack_front . $step]
                  set slack_back [expr $slack_back + $step]
         }
         # slack adjustment for pull will be $num_step * $step]
}
```

In such an embodiment, for each candidate, if the front slack is less than the back slack, the back slack may be degraded to improve the front slack. This may be done only if, in various embodiments, the front slack is less than a threshold value and the back slack remains above an adjusted front slack. Therefore, there may be candidates for which no adjustment occurs. If the candidate is to be adjusted, the front slack may be increased, and the back slack decreased by a quantized step amount, until the above conditions are met. It is understood that the above is merely one illustrative example to which the disclosed subject matter is not limited.

In the illustrated embodiment, the system 200 may include a timing model generator 218. In some embodiments, the timing model generator 218 may be configured to update a timing model of the digital circuit model 202 after the clock pull scheduler 214 has processed the digital circuit model 202. In various embodiments, the system 200 may include an incremental latency adjuster 219 configured to adjust the latency measurements of the digital model 202.

In the illustrated embodiment, the system 200 may include a clock push scheduler 216. In such an embodiment, the clock push scheduler 216 may be configured for increasing the clock latency of the clock signal to the respective push candidate end-point by a second quantized amount. After the clock push scheduler 216 has modified the clock skew schedules, the timing model of the digital circuit model 202 may be updated (e.g., by Timing Model Generator 218, Incremental Latency Adjuster 219).

Although, in the illustrated embodiment, the clock pull scheduler 214 processes the digital circuit model 202 before the clock push scheduler 216 (e.g., a loop that includes components 212, 214, 218, 219, 212, 216, and 218). In another embodiment, the processing order may be reversed (e.g., a loop that includes components 212, 216, 218, 219, 212, 214, and 218). It is understood that the above is merely one illustrative example to which the disclosed subject matter is not limited.

As described above, in one embodiment, for each candidate, if the back slack is less than the front slack, the front slack may be degraded to improve the back slack. This may be done only if, in various embodiments, the back slack is less than a threshold value and the front slack remains above an adjusted back slack. Therefore, there may be candidates for which no adjustment occurs. If the candidate is to be adjusted, the front slack may be decreased, and the back slack increased by a quantized step amount, until the above conditions are met. It is understood that the above is merely one illustrative example to which the disclosed subject matter is not limited.

In various embodiments, by splitting end-points into the two push/pull buckets and then executing a push clock skew schedule adjustment & pull clock skew schedule adjustment through separate steps, scheduling conflicts may be avoided. In such an embodiment, the traditional need for a costly incremental timing update after scheduling every end-point may be avoided. In such an embodiment, the timing model may be updated after the push/pull candidates in the entire digital model 202 have been processed.

In the illustrated embodiment, the system 200 may pass the digital circuit model 202 through the clock pull scheduler 214, clock push scheduler 216, timing model generator 218, incremental timing adjuster 219 loop a number of times. In such an embodiment, properly determining the clock skew schedule of an end-point often depends on timing slacks of multiple pipeline stages and dynamically borrowing time from those subsequent multi-stages. This generally involves multi-stage look ahead scheduling, which is a complex problem. By performing multiple iteration-loops through single-stage scheduling (e.g., clock pull scheduler 214, clock push scheduler 216 etc.) resolves this hurdle by allowing clock skew scheduling changes to propagate through the design until a steady state has been achieved.

In the illustrated embodiment, the system 200 may produce the resultant clock skew schedules 208 after a number of iterations of the clock pull scheduler 214/clock push scheduler 216, timing model generator 218, incremental latency adjuster 219, loop. In some embodiments, these clock skew schedules 208 may be provided to a further stage in the digital circuit design process.

In one such embodiment, the further stage (and system 200) may include a clock-gater and/or skew buffer adjuster 220. In some embodiments, the clock-gater and/or skew buffer adjuster 220 may be configured to take the digital circuit model 202 and clock skew schedules 208 as input and adjust various circuits (e.g., skew buffers, clock-gaters, etc.) within the digital circuit model 202 to affect the timing alterations determined by the system 200. It is understood that the above is merely one illustrative example to which the disclosed subject matter is not limited.

In various embodiments, the further stage may include a static and/or dynamic timing evaluator 230. In such an embodiment, the static and/or dynamic timing evaluator 230 may be configured to perform static and/or dynamic timing analysis on the digital circuit model 202 given the clock skew schedules 208. In such an embodiment, during physical synthesis and/or timing optimization, applying the clock skew schedules 208 may "shake-up" the digital circuit model 202 in such a way that the timing model converges in a desirable manner. The static and/or dynamic timing evaluator 230 may produce a circuit physical model 292 that represents, not just the functional characteristics of the circuit, but also the physical characteristics of the circuit.

Figure 3:
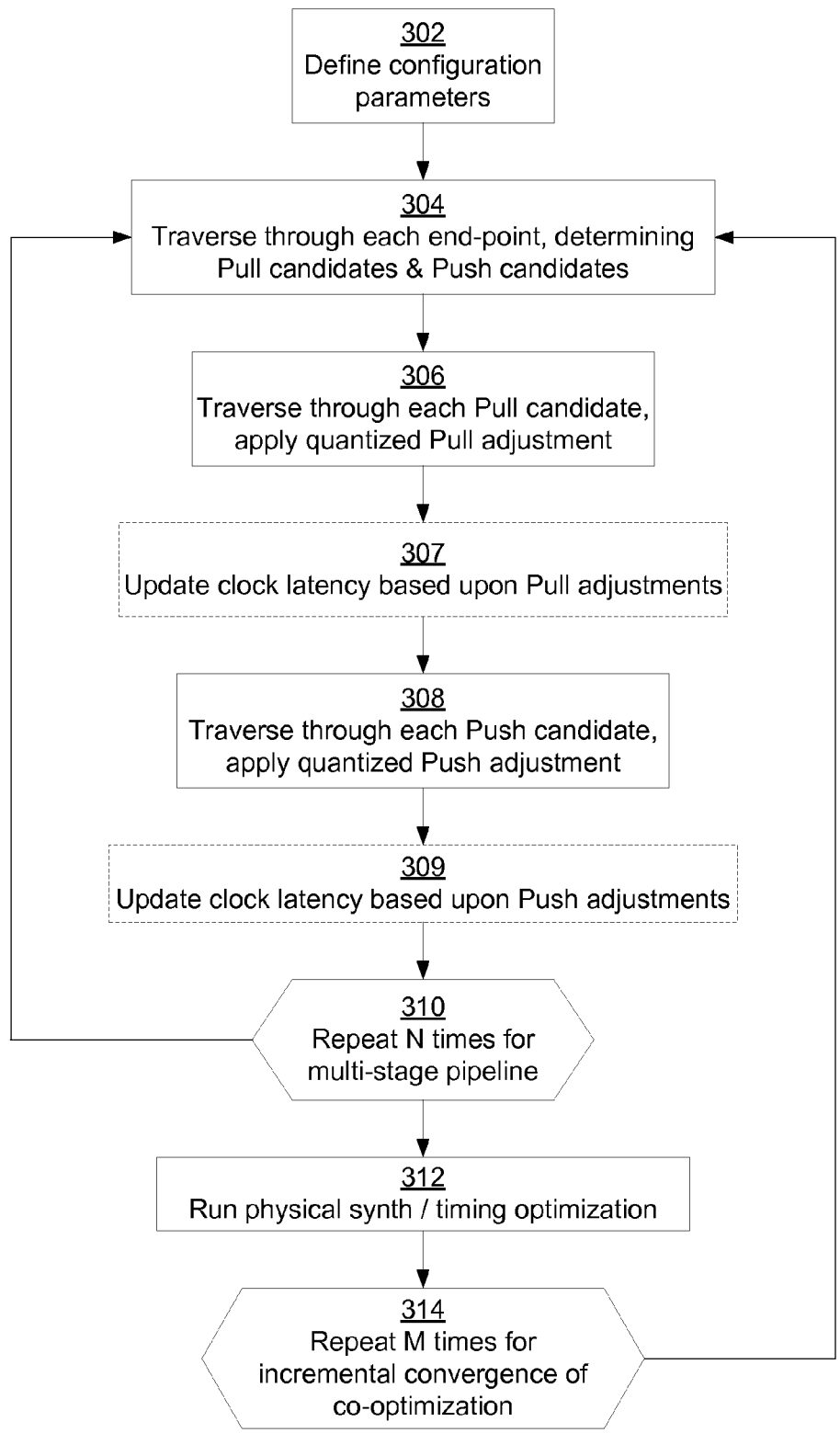
FIG. 3 is a flowchart of an example embodiment of a technique in accordance with the disclosed subject matter.

FIG. 3 is a flowchart of an example embodiment of a technique 300 in accordance with the disclosed subject matter. In various embodiments, the technique 300 may be used or produced by the systems such as those of FIG. 1, 2, or 4. Although, it is understood that the above are merely a few illustrative examples to which the disclosed subject matter is not limited. It is understood that the disclosed subject matter is not limited to the ordering of or number of actions illustrated by technique 300.

Block 302 illustrates that, in one embodiment, one or more configuration parameters may be defined, as described above. In various embodiments, the configuration parameters may include a maximum push limit, a maximum pull limit, a push step size, a pull step size, and/or a slack threshold to skew value, as described above. It is understood that the above are merely a few illustrative examples to which the disclosed subject matter is not limited.

Block 304 illustrates that, in one embodiment, the system (e.g., system 200 of FIG. 2, etc.) may traverse through each end-point and determine Pull candidates and Push candidates, as described above. In various embodiments, a Push candidate may include an end-point that includes a front slack less than its back-slack, a front-slack that is negative, and the front slack worse than the slack threshold to skew value, as described above. In various embodiments, a Pull candidate may include an end-point that includes a front slack greater than its back-slack, a back-slack that is negative, and the back slack worse than the slack threshold to skew value, as described above. It is understood that the above are merely a few illustrative examples to which the disclosed subject matter is not limited.

Block 306 illustrates that, in one embodiment, the system (e.g., system 200 of FIG. 2, etc.) may traverse through each Pull candidates and apply a quantized Pull adjustment to the clock skew schedule, as described above. In such an embodiment, the quantized Pull adjustment to the clock skew schedule may be dictated by the Pull Step Size parameter, as described above. In one embodiment, the Pull adjustment may be calculated as shown in the pseudo-code described above.

Block 307 illustrates that, in one embodiment, the timing model may be updated based upon the Pull adjustments. In another embodiment, Block 307 may not be included in technique 300. In such an embodiment, the timing model may be updated only once for each iteration. It is understood that the above is merely one illustrative example to which the disclosed subject matter is not limited.

Block 308 illustrates that, in one embodiment, the system (e.g., system 200 of FIG. 2, etc.) may traverse through each Push candidates and apply a quantized Push adjustment to the clock skew schedule, as described above. In such an embodiment, the quantized Push adjustment to the clock skew schedule may be dictated by the Push Step Size parameter, as described above. In one embodiment, the Push adjustment may be calculated as shown in the pseudo-code described above.

Block 309 illustrates that, in one embodiment, the timing model may be updated based upon the Push adjustments. In another embodiment, Block 309 may be performed based upon both the Push adjustments and the Pull adjustments. In such an embodiment, the timing model may be updated only once for each iteration. It is understood that the above is merely one illustrative example to which the disclosed subject matter is not limited.

Block 310 illustrates that, in one embodiment, the process may be repeated a number of times, as described above. In such an embodiment, the slacks of multiple pipeline stages may be adjusted, as described above. In various embodiments, by dynamically borrowing time from subsequent multi-stages, the iterative process of Block 310 may affect multi-stage look ahead scheduling, as described above.

Block 312 illustrates that, in one embodiment, physical synthesis and/or timing optimization may be executed, as described above. In such an embodiment, this may allow for concurrent scheduling and data path optimization, as described above. Block 314 illustrates that, in one embodiment, technique 300 may be repeated a number of times, as described above. In various embodiments, this may "shake up" the digital circuit model 202 in such a way that time converges in a desirable manner.

Figure 4:
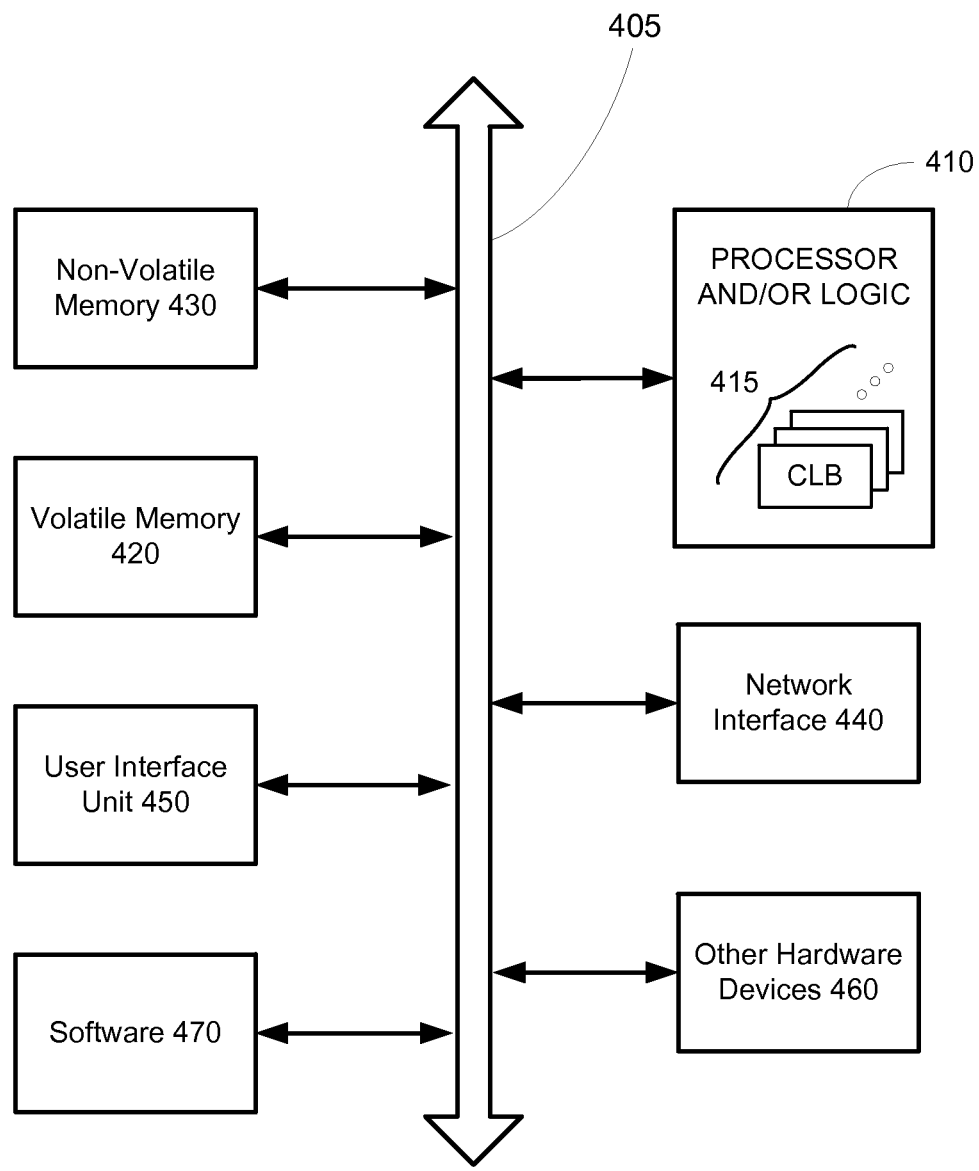
FIG. 4 is a schematic block diagram of an information processing system that may include devices formed according to principles of the disclosed subject matter.

FIG. 4 is a schematic block diagram of an information processing system 400, which may include semiconductor devices formed according to principles of the disclosed subject matter.

Referring to FIG. 4, an information processing system 400 may include one or more of devices constructed according to the principles of the disclosed subject matter. In another embodiment, the information processing system 400 may employ or execute one or more techniques according to the principles of the disclosed subject matter.

In various embodiments, the information processing system 400 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 400 may be used by a user (not shown).

The information processing system 400 according to the disclosed subject matter may further include a central processing unit (CPU), logic, or processor 410. In some embodiments, the processor 410 may include one or more functional unit blocks (FUBs) or combinational logic blocks (CLBs) 415. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 400 according to the disclosed subject matter may further include a volatile memory 420 (e.g., a Random Access Memory (RAM), etc.). The information processing system 400 according to the disclosed subject matter may further include a non-volatile memory 430 (e.g., a hard drive, an optical memory, a NAND or Flash memory, etc.). In some embodiments, either the volatile memory 420, the non-volatile memory 430, or a combination or portions thereof may be referred to as a "storage medium". In various embodiments, the volatile memory 420 and/or the non-volatile memory 430 may be configured to store data in a semi-permanent or substantially permanent form.

In various embodiments, the information processing system 400 may include one or more network interfaces 440 configured to allow the information processing system 400 to be part of and communicate via a communications network. Examples of a Wi-Fi protocol may include, but are not limited to, Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to, IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 400 according to the disclosed subject matter may further include a user interface unit 450 (e.g., a display adapter, a haptic interface, a human interface device, etc.). In various embodiments, this user interface unit 450 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 400 may include one or more other devices or hardware components 460 (e.g., a display or monitor, a keyboard, a mouse, a camera, a fingerprint reader, a video processor, etc.). It is understood that the above are merely a few illustrative examples to which the disclosed subject matter is not limited.

The information processing system 400 according to the disclosed subject matter may further include one or more system buses 405. In such an embodiment, the system bus 405 may be configured to communicatively couple the processor 410, the volatile memory 420, the non-volatile memory 430, the network interface 440, the user interface unit 450, and one or more hardware components 460. Data processed by the processor 410 or data inputted from outside of the non-volatile memory 430 may be stored in either the non-volatile memory 430 or the volatile memory 420.

In various embodiments, the information processing system 400 may include or execute one or more software components 470. In some embodiments, the software components 470 may include an operating system (OS) and/or an application. In some embodiments, the OS may be configured to provide one or more services to an application and manage or act as an intermediary between the application and the various hardware components (e.g., the processor 410, a network interface 440, etc.) of the information processing system 400. In such an embodiment, the information processing system 400 may include one or more native applications, which may be installed locally (e.g., within the non-volatile memory 430, etc.) and configured to be executed directly by the processor 410 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 410.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

In various embodiments, a computer readable medium may include instructions that, when executed, cause a device to perform at least a portion of the method steps. In some embodiments, the computer readable medium may be included in a magnetic medium, optical medium, other medium, or a combination thereof (e.g., CD-ROM, hard drive, a read-only memory, a flash drive, etc.). In such an embodiment, the computer readable medium may be a tangibly and non-transitorily embodied article of manufacture.

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. A method of adjusting clock skews, the method comprising:
   receiving a circuit model that includes logic circuits at least partially controlled by a clock network, wherein the clock network, at least partially, controls each of the logic circuits by inputting a respective clock signal to an end-point of a respective logic circuit;
   providing an incremental latency adjustment to the circuit model by:
      for each end-point that is associated with a negative front slack, adjusting a clock skew schedule of a respective end-point by a first quantized amount, up to a maximum push threshold,
      for each end-point that is associated with a negative back-slack, adjusting the clock skew schedule of a respective end-point that is associated by a second quantized amount, up to a maximum pull threshold, and
      reevaluating at least one of the negative front slack and the negative back-slack for each end-point in the circuit model after adjusting all the clock skew schedules of the one-or more end-points; and
   repeating, a plurality of times, the step of providing the incremental latency adjustment to the circuit model.

2. The method of claim 1, wherein providing the latency adjustment update to the circuit model includes avoiding push/pull adjustment clock latency conflicts between end-points by adjusting the end-points associated with the negative front slack, and adjusting the end-points associated with the negative back slack in separate steps.

3. The method of claim 1, wherein adjusting the clock skew of a respective end-point includes:
   provisionally estimating a new slack associated with the end-point after adjusting the clock-skew schedule of the end-point, and not performing either dynamic timing verification, static timing analysis, nor both; and
   wherein repeating the step of providing the latency adjustment update to the circuit model includes determining the end-points that are the candidates for adjustment based upon the provisionally estimated new slack.

4. The method of claim 1, wherein for each end-point that is associated with a negative back slack, adjusting the clock skew schedule of a respective end-point that is associated with a negative back slack by a quantized amount includes:
   if both a front slack and a back slack are negative, adjusting the clock skew schedule to, at least partially, equalize the front slack and the back slack within the quantization step size.

5. The method of claim 1, wherein repeating, a plurality of times, the step of providing the latency adjustment update to the circuit model includes:
   effectively performing multi-stage look ahead scheduling of clock slack for a plurality of pipeline stages.

6. The method of claim 1, wherein the quantized amount by which the clock skew schedule is adjusted is a delay associated with a skew buffer circuit; and
   wherein the maximum pull threshold is smaller than the maximum push threshold.

7. The method of claim 1, wherein repeating, a plurality of times, the step of providing the latency adjustment update to the circuit model comprises:
   co-optimizing the useful-skew scheduling with a physical synthesis optimization so as to reorganize the circuit model in a direction of timing convergence.

8. The method of claim 1, wherein determining one or more end-points that are candidates for adjustment of the respective end-point's clock skew schedule includes:
   categorizing end-points into one or at least two categories, wherein the at least two categories includes Pull Candidates, and Push Candidates.

9. The method of claim 1, wherein providing the latency adjustment update to the circuit model includes:
   selecting a preference between worst-negative-slack and total-negative-slack via the selection of the slack threshold to skew and maximum push/pull limits.

10. A computer program product for adjusting clock skew schedules of a digital circuit, the computer program product being tangibly embodied on a computer-readable medium and including executable code that, when executed, is configured to cause a data processing apparatus to:
   receive a circuit model that includes logic circuits at least partially controlled by a clock network, wherein the clock network, at least partially, controls each of the logic circuits by inputting a respective clock signal to an end-point of a respective logic circuit; and
   provide an incremental timing update to the circuit model by:
      for each end-point that is associated with a negative front slack, adjust a clock skew schedule of a respective end-point that is associated with negative front slack by a first quantized amount, up to a maximum push threshold,
      for each end-point that is associated with a negative back slack, adjust the clock skew schedule of a respective end-point that is associated with negative back slack by a second quantized amount, up to a maximum pull threshold, and
      reevaluate at least one of the negative front slack and at least one of the negative back slack for each endpoint in the circuit model after adjusting all the clock skew schedules of the one-or more end-points.

11. The computer program product of claim 10, wherein the executable code that, when executed, is configured to cause the data processing apparatus to:

not perform a separate timing update after a clock skew schedule is adjusted for each respective end-point.

12. The method of claim 1, wherein adjusting a clock skew schedule includes adjusting a clock skew schedule based upon a reduction in power consumption.

13. The method of claim 1, wherein adjusting a clock skew schedule for setup reduction includes adjusting a clock skew schedule to improve, at least in part, hold timings.

14. The method of claim 1, wherein adjusting a clock skew schedule comprises adjusting a clock skew schedule for hold reduction.

15. The method of claim 14, wherein adjusting a clock skew schedule comprises scheduling for hold reduction to improve, at least in part, setup timings.

* * * * *